(12) United States Patent
Kim et al.

(10) Patent No.: US 12,000,795 B2
(45) Date of Patent: Jun. 4, 2024

(54) EDDY CURRENT SENSOR HAVING IMPROVED CRACK DETECTION CAPABILITY, AND EDDY CURRENT INSPECTION DEVICE INCLUDING SAME

(71) Applicant: LG ENERGY SOLUTION, LTD., Seoul (KR)

(72) Inventors: Seok Jin Kim, Daejeon (KR); Su Taek Jung, Daejeon (KR); Sang Hyun Koo, Daejeon (KR); Jung Hoon Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 258 days.

(21) Appl. No.: 17/626,285

(22) PCT Filed: Aug. 14, 2020

(86) PCT No.: PCT/KR2020/095118
§ 371 (c)(1),
(2) Date: Jan. 11, 2022

(87) PCT Pub. No.: WO2021/034178
PCT Pub. Date: Feb. 25, 2021

(65) Prior Publication Data
US 2022/0268734 A1    Aug. 25, 2022

(30) Foreign Application Priority Data

Aug. 16, 2019 (KR) .......................... 10-2019-0100183

(51) Int. Cl.
*G01N 27/90* (2021.01)
*H01M 10/42* (2006.01)

(52) U.S. Cl.
CPC .... *G01N 27/9006* (2013.01); *H01M 10/4228* (2013.01); *H01M 10/4285* (2013.01)

(58) Field of Classification Search
CPC .................................................. G01N 27/9006
See application file for complete search history.

(56) References Cited

U.S. PATENT DOCUMENTS

| 7,355,395 B2 * | 4/2008 | Redko | ................ | G01N 27/9026 324/240 |
| 7,783,438 B2 * | 8/2010 | Redko | ................ | G01R 31/3865 324/426 |

(Continued)

FOREIGN PATENT DOCUMENTS

| CN | 103657983 A | 3/2014 |
| CN | 1071292759 A | 9/2017 |

(Continued)

OTHER PUBLICATIONS

International Search Report (with partial translation) and Written Opinion dated Nov. 30, 2020 issued in corresponding International Patent Application No. PCT/KR2020/095118.

(Continued)

*Primary Examiner* — Walter L Lindsay, Jr.
*Assistant Examiner* — Milton Gonzalez
(74) *Attorney, Agent, or Firm* — Morgan, Lewis & Bockius LLP

(57) ABSTRACT

An eddy current sensor for deriving an eddy current and sensing the derived eddy current in order to detect a crack in a battery cell, the eddy current sensor comprises: a core unit in which a coil is wound around a magnetic member; and a case for accommodating the core unit of which there are at least two, which are arranged so that the central axis of the coil is oriented in the thickness direction of the battery cell.

13 Claims, 6 Drawing Sheets

(56) References Cited

U.S. PATENT DOCUMENTS

| | | | |
|---|---|---|---|
| 7,845,232 B2 * | 12/2010 | Redko | G01H 1/16 |
| | | | 73/616 |
| 8,049,494 B2 | 11/2011 | Lepage et al. | |
| 2004/0178790 A1 | 9/2004 | Gifford et al. | |
| 2008/0315871 A1 | 12/2008 | Lepage et al. | |
| 2010/0207620 A1 | 8/2010 | Gies | |
| 2015/0340744 A1 | 11/2015 | Knobloch et al. | |

FOREIGN PATENT DOCUMENTS

| | | | | |
|---|---|---|---|---|
| JP | H09-274017 A | 10/1997 | | |
| JP | 2006-319303 A | 11/2006 | | |
| JP | 2009008645 A | 1/2009 | | |
| JP | 2009-229337 A | 10/2009 | | |
| JP | 2009-252644 A | 10/2009 | | |
| JP | 2012026737 A | 2/2012 | | |
| JP | 5243828 B2 | 7/2013 | | |
| JP | 2015-105947 A | 6/2015 | | |
| JP | 2018-132469 A | 8/2018 | | |
| KR | 20-0204290 Y1 | 11/2000 | | |
| KR | 10-2009-0002368 A | 1/2009 | | |
| KR | 10-2009-0071708 A | 7/2009 | | |
| KR | 10-2012-0139110 A | 12/2012 | | |
| KR | 10-2017-0027284 A | 3/2017 | | |
| KR | 10-2018-0092445 | 8/2018 | | |
| WO | WO-2020009337 A1 * | 1/2020 | | G01N 27/025 |

OTHER PUBLICATIONS

Extended European Search Report issued in corresponding European Patent Application No. 20855037.6 dated Jul. 21, 2022.

* cited by examiner

[FIG. 1]
-- PRIOR ART --
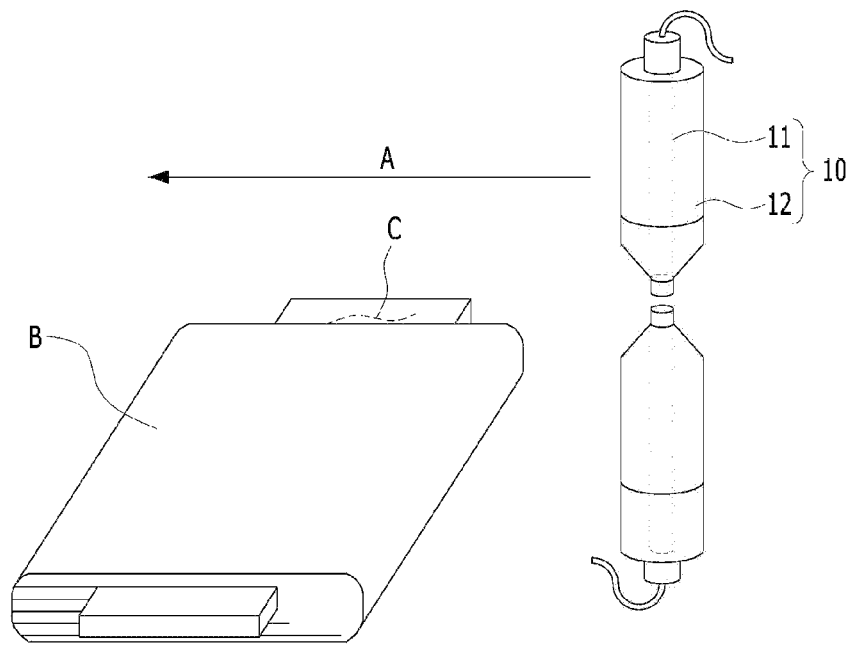

[FIG. 2]
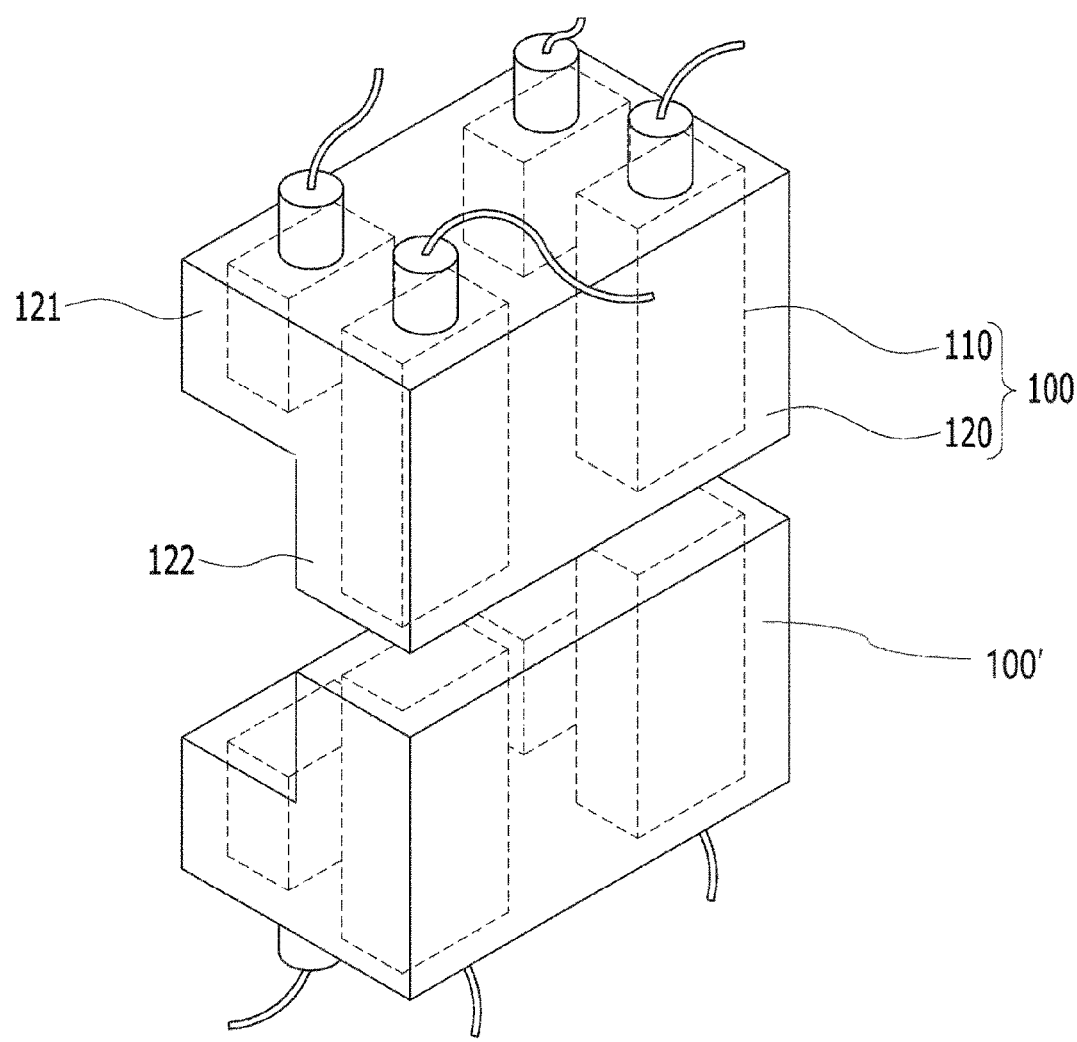

[FIG. 3]
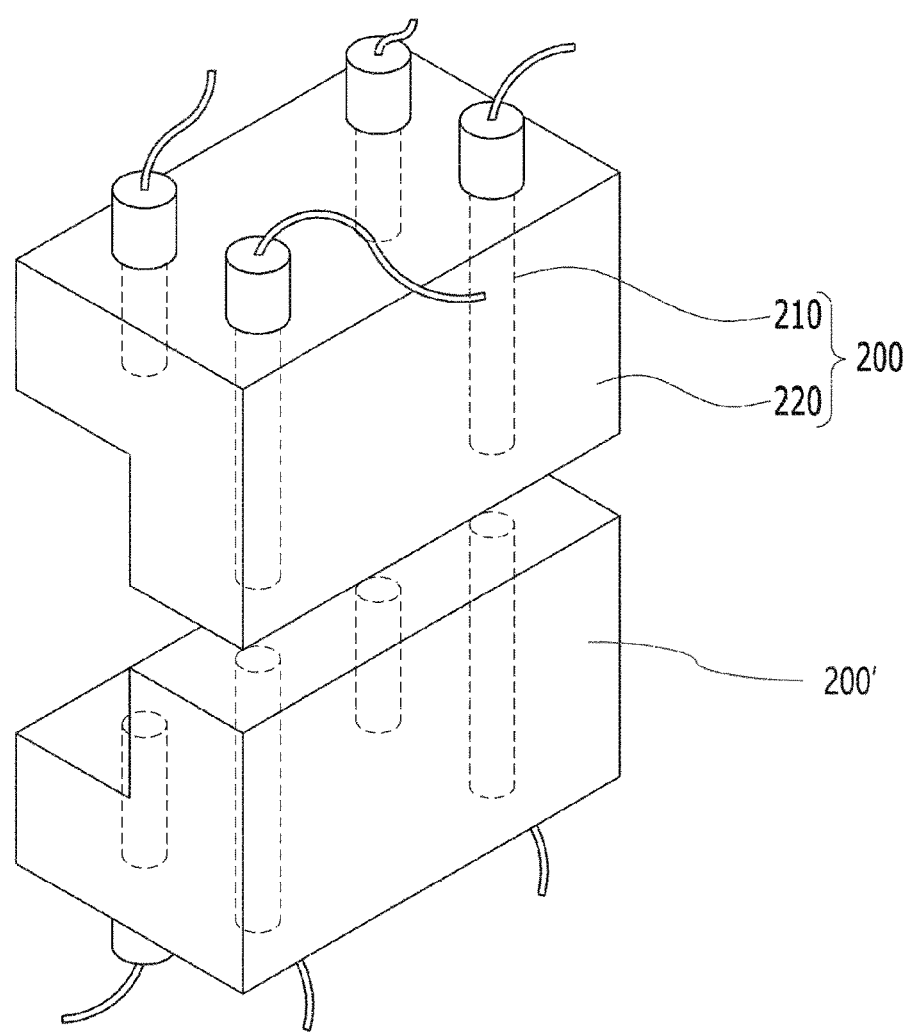

[FIG. 4]
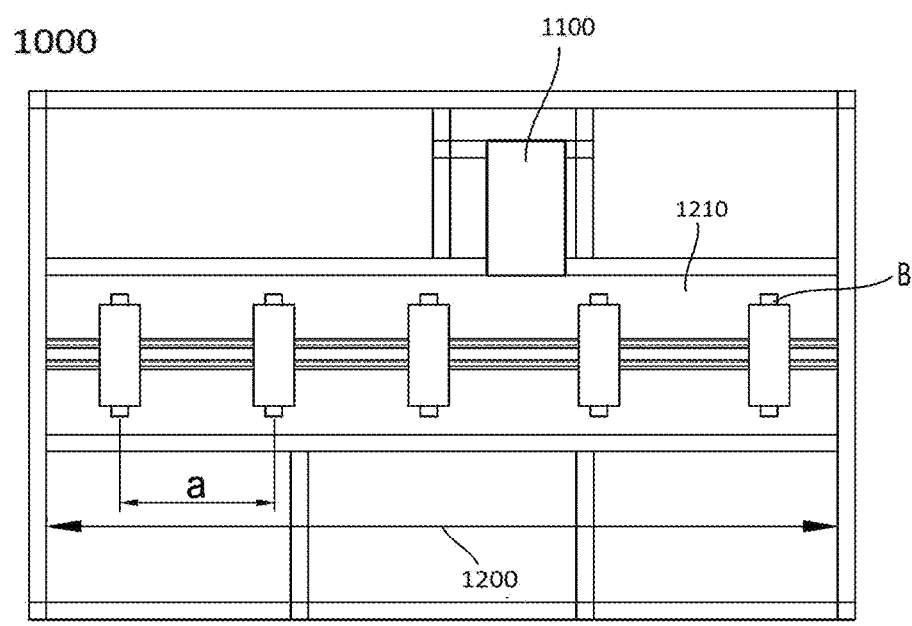

[FIG. 5]
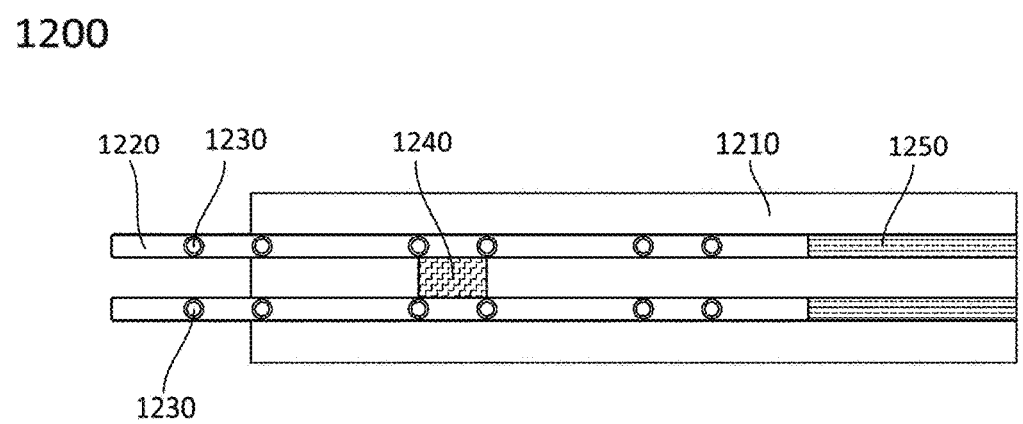

[FIG. 6]
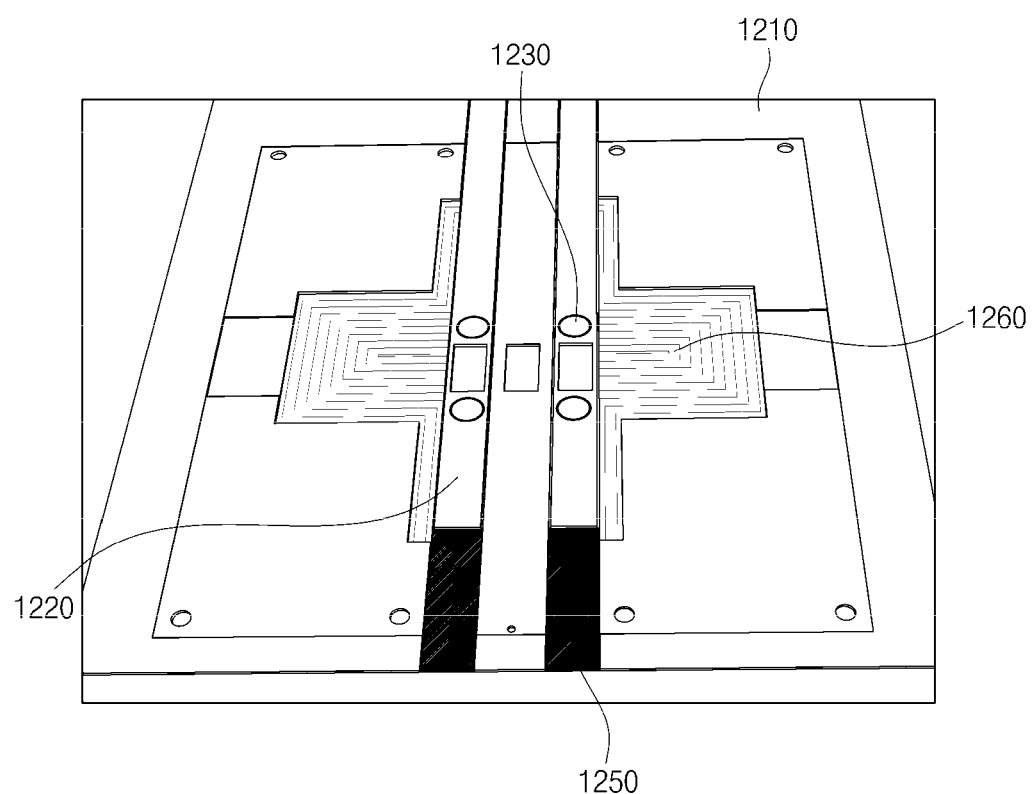

EDDY CURRENT SENSOR HAVING IMPROVED CRACK DETECTION CAPABILITY, AND EDDY CURRENT INSPECTION DEVICE INCLUDING SAME

TECHNICAL FIELD

This application claims the benefit of priority based on Korean Patent Application No. 10-2019-0100183, filed on Aug. 16, 2019, and the entire contents of the Korean patent application are incorporated herein by reference.

The present invention relates to a sensor and an inspection device for detecting cracks inside a lithium secondary battery by a non-destructive method, and more particularly, to an eddy current sensor for detecting electrode cracks, tab cracks, and welding portion cracks of a battery cell using eddy current, and an eddy current inspection device including the same.

BACKGROUND ART

The lithium secondary battery can be classified into a jelly-roll type (wound type) electrode assembly in which positive electrodes and negative electrodes of a long sheet type are wound with a separator interposed therebetween, a stack-folding type electrode assembly of a structure in which unit cells, such as bi-cells or full cells, stacked with positive and negative electrodes of a predetermined unit laminated through a separator, are wound, etc. according to the structure of the positive electrode, the negative electrode, and the electrode assembly having the structure of a separator interposed between the positive electrode and the negative electrode.

Such a secondary battery is manufactured by injecting an electrolyte, which is a liquid electrolyte, in a state where the electrode assembly is accommodated in the battery container, and sealing the battery container.

During the manufacturing process of the above electrode or the assembly process of the electrode assembly, cracks may occur on the electrodes, tabs, and welds due to differences in elongation between a coated part and an uncoated part, physical external force due to welding, etc., and such cracks may cause low voltage defects.

In the case of a stack-folding type battery cell, due to the characteristics of the stack-folding process, assembly defects occurring during the folding process cannot be easily found through vision inspection due to cracks inside the folding cell, and a method for non-destructively detecting cracks in the sealed battery cell after sealing is completed is required.

On the other hand, eddy current has characteristics that change according to changes in the state, location, defect, material, etc. of the surface to be inspected, and technologies for detecting foreign substances or cracks to be inspected using such eddy current characteristics are known.

FIG. 1 shows a shape of a conventional eddy current sensor. Referring to this, the sensor 10 that induces the eddy current and detects the induced eddy current has a pencil-type shape, and specifically, a core unit 11 having a coil wound around a cylindrical magnetic member is embedded in a case 12.

In the case of using such a pencil type eddy current sensor, since the diameter of the core unit is usually several millimeters, the eddy current inspection is performed in a manner in which the eddy current sensor screens the object to be inspected. However, such a screening measurement method has a problem in that the sensing position of the sensor is not accurate, so the error range of the measured value is widened, and the over-check rate is high.

Therefore, in detecting battery cell cracks, when an eddy current sensor is used, it is necessary to develop a technology for improving detection power.

DISCLOSURE

Technical Problem

An object of the present invention is to provide a novel eddy current sensor capable of improving detection power and provide a device of detecting a crack of a battery cell using such an eddy current sensor.

Technical Solution

The present invention provides an eddy current sensor for inducing an eddy current and detecting the induced eddy current to detect a crack in a battery cell, the eddy current sensor including: at least two core units in which a coil is wound around a magnetic member; and a case which accommodates the core unit, wherein each of the core units is arranged such that a central axis of the coil is oriented in a thickness direction of a battery cell.

In an embodiment of the present invention, the case includes: a first stage extending toward a battery cell body in a longitudinal direction of the battery cell while having a stepped step corresponding to a shape extending from the battery cell body to an electrode lead, and having a cuboid shape; and a second stage extending toward the electrode lead in a thickness direction of the battery cell from the first stage while having a cuboid shape, wherein, the first stage and the second stage are integrated to form the stepped step, and wherein in an area of a horizontal section cut parallel to a ground, an area of a horizontal section of the first stage is larger than an area of a horizontal section of the second stage.

In an embodiment of the present invention, at least one pair of core units are spaced apart from each other on an extension line in a first direction parallel to a width direction of the battery cell.

In an embodiment of the present invention, the eddy current sensor further includes two pairs of core units, wherein one pair of core units may be spaced apart and disposed on the extension line in the first direction parallel to the width direction of the battery cell, and wherein the remaining pair of core units may be parallel to the width direction of the battery cell, and may be spaced apart on an extension line in a second direction different from the first direction. Herein, the spaced distance may be 50 to 100% of the width of the battery cell.

In the eddy current sensor according to an embodiment of the present invention, one pair of core units may be disposed at the first stage, and the remaining pair of core units may be disposed at the second stage.

The eddy current sensor of the present invention includes: a first sensor configured to induce an eddy current; and a second sensor configured to sense an eddy current signal induced by the first sensor, wherein each of the first sensor and the second sensor includes the core unit and the case.

The magnetic member constituting the core unit of the present invention has a cylindrical column or rectangular column shape.

In the eddy current sensor of the present invention, a crack may be detected by one-point sensing in a state that the battery cell is fixed. Herein, the crack is a crack generated at one or more locations selected from an electrode tab, a tab welding portion and a lead welding portion.

The present invention provides a device for detecting a crack of a battery cell, including: the eddy current sensor; a transfer unit configured to sequentially transfer a plurality of battery cells from a point where the battery cells are input to a point where the battery cells are taken out; and a controller configured to be electrically connected to the eddy current sensor and receive, evaluate and control the eddy current signal sensed by the eddy current sensor.

In an embodiment of the present invention, the transfer unit includes: a transfer die configured to be extended from an input point to a discharge point of the battery cell; and a transfer means configured to transfer the battery cell.

In an embodiment of the present invention, the transfer means includes: a lifting unit configured to elevate the battery cell from the transfer die; and a driving unit configured to be coupled with the lifting unit to be movable and allow the lifting unit to be reciprocated in a horizontal direction.

Advantageous Effects

The eddy current sensor of the present invention enables one-point sensing, so that the detection resolution is high and there is no unchecked area, thereby improving the crack detection power.

The eddy current sensor of the present invention exhibits an effect of improving detection power because there is no possibility of generating an abnormal magnetic field.

The crack detection device of the present invention exhibits an effect of lowering an overcheck rate as the crack detection power of the eddy current sensor is improved, and has an advantage of automating non-destructive detection of cracks using eddy currents.

BRIEF DESCRIPTION OF THE DRAWINGS

FIG. 1 is a diagram showing a conventional eddy current sensor.

FIG. 2 is a schematic diagram of an eddy current sensor according to an embodiment of the present invention.

FIG. 3 is a schematic diagram of an eddy current sensor according to another embodiment of the present invention.

FIG. 4 is a schematic diagram of a crack detection device according to the present invention.

FIG. 5 is a schematic diagram showing a transfer unit in the crack detection device of FIG. 4.

FIG. 6 is a diagram showing a transfer die according to an embodiment of the present invention.

DETAILED DESCRIPTION OF THE PREFERRED EMBODIMENTS

The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention. Accordingly, the embodiments described in the specification and the configurations described in the drawings are only the most preferred embodiments of the present invention, and do not represent all of the technical ideas of the present invention. It is to be understood that there may be various equivalents and variations in place of them at the time of filing the present application.

Also, throughout the specification, when an element is referred to as "including" an element, it is understood that the element may include other elements as well unless specifically stated otherwise.

Hereinafter, the present invention will be described in detail.

FIG. 2 shows an eddy current sensor according to an embodiment of the present invention. Referring to FIG. 2, the eddy current sensor 100 and 100' of the present invention for detecting a battery cell crack includes:

a core unit 110 in which a coil is wound around a magnetic member; and a case 120 accommodating the core unit, and includes at least two or more core units.

Further, each of the core units is arranged such that the central axis of the coil is oriented in the thickness direction of the battery cell.

As described above, the conventional eddy current sensor detects cracks by screening an inspection area of a battery cell as an object to be inspected. The screening method refers to a method in which a sensor continuously measures an eddy current signal value while changing an inspection area along a certain axis. The crack detection method according to the screening method has a disadvantage of a high over-check rate as a result of widening the error range of the measured value of the eddy current signal due to the inaccurate detection position of the sensor.

Accordingly, the inventors of the present invention devised a novel shape of an eddy current sensor optimized for a one-point measurement method in order to increase the detection position precision. Here, the one-point measurement method refers to a method of measuring an eddy current signal value by setting one inspection point or inspection area.

In the eddy current sensor of the present invention, by changing the shape of the conventional pencil-type sensor, the size of the case has been changed to accommodate a plurality of cores, and in order to facilitate the detection of cracks in the terrace part, which is the area of the electrode tab, electrode tab welding portion, and lead welding portion, which are areas where cracks occur frequently in the battery cell, it has a step corresponding to the shape of the terrace part in designing the shape of the case.

In the present invention, the crack of the battery cell is a crack generated on at least one location selected from among electrode tabs, tab welding portions, and lead welding portions.

The crack of the electrode tab may be a crack generated due to the difference in elongation between a coated part and an uncoated part or a crack caused by vibration or external force during welding due to the accumulation of stress on the wrinkles at the boundary.

The crack on a welding portion may be a non-weld portion formed by insufficient welding during welding or a crack generated during a welding process.

When the electrode assembly is sealed with a battery case such as a laminate sheet, the inside of the battery cell is covered by the battery case, and accordingly, cracks generated on the electrode tab, the tab welding portion and the lead welding portion listed above cannot be observed from the outside of the battery cell, but the cracks can be detected by using the eddy current sensor of the present invention.

Referring to FIG. 2, in one example, the case 120 includes:

a first stage 121 extending toward a battery cell body in a longitudinal direction of the battery cell while having a stepped step corresponding to a shape extending from the battery cell body to an electrode lead, and having a cuboid shape; and a second stage 122 extending in the thickness direction of the battery cell from the first stage 121 while having a cuboid shape.

Herein, the first stage and the second stage are integrated to form the stepped step.

Further, in the area of the horizontal section cut parallel to the ground, the area of the horizontal section of the first stage is larger than the area of the horizontal section of the second stage. The case serves to protect the core unit for sensing the induced eddy current from external impact.

At this time, the at least one pair of core units are disposed to be spaced apart from each other on an extension line in the first direction parallel to the width direction of the battery cell. In this case, the separation distance may be 50 to 100% of the width of the battery cell, and the separation distance may be appropriately changed so that an unchecked area is not generated.

Referring to FIG. 2, in one example, the eddy current sensor 100 includes two pairs of core units 110. At this time, one pair of core units are spaced apart on an extension line in the first direction parallel to the width direction of the battery cell, and the remaining pair of core units are parallel to the width direction of the battery cell and are spaced apart on an extension line in a second direction different from the first direction. That is, a total of four core units form a 2×2 matrix and are separated from each other.

In this case, the pair of core units are disposed at the first stage, and the other pair of core units are disposed at the second stage, and as such, the detection resolution may be increased while minimizing an unchecked area.

The eddy current sensor 100 and 100' includes a first sensor 100 for inducing an eddy current; and a second sensor 100' for detecting an eddy current signal induced by the first sensor.

Each of the first sensor 100 and the second sensor 100' includes a core unit and a case, and is electrically connected to the outside for induction of eddy current and reception of eddy current signals.

When an alternating current is applied to the coil constituting the core unit of the first sensor 100, a primary magnetic field is formed around the coil. The coil may have a spring shape, but is not limited thereto. When the first sensor in which the primary magnetic field is formed is placed in an area adjacent to the battery cell as the object to be inspected, induced electromotive force is generated in the battery cell due to electromagnetic induction, and an eddy current that interferes with the primary magnetic field flows. As such, the first sensor induces an eddy current in the battery cell.

The second sensor 100' is located on the opposite surface of the first sensor 100 based on the battery cell as an object to be inspected. The second sensor functions to detect the eddy current signal induced by the first sensor. The second sensor detects attenuated eddy current signals, which are generated by attenuation such as formation, reflection, and absorption of the eddy current induced by the first sensor, due to factors such as state, position, defect, and material of the battery cell, which is the object to be inspected. Therefore, when there is a crack on the electrode tab, the electrode tab welding portion, or the lead welding portion, the eddy current signal changes, and the second sensor detects the eddy current signal.

The core unit 110 has a coil wound around a magnetic member having a rectangular column shape in the longitudinal direction of the magnetic member. When the magnetic member has a rectangular column shape, there is an advantage in that the detection resolution is increased while the unchecked area disappears. However, there is a possibility that a normal magnetic field may not be generated at the edges of the rectangular column.

FIG. 3 shows an eddy current sensor according to another embodiment of the present invention. Referring to FIG. 3, the eddy current sensor 200 and 200' of the present invention for detecting a battery cell crack includes:

a core unit 210 in which a coil is wound around a magnetic member; and a case 220 accommodating the core unit, and includes at least two or more core units.

Further, each of the core units is arranged such that the central axis of the coil is oriented in the thickness direction of the battery cell.

The magnetic member constituting the core unit has a cylindrical column shape. Since the magnetic member has a cylindrical column shape, the possibility of generating an abnormal magnetic field may be relatively low, compared to a case where the magnetic member has a rectangular column shape, but there may be an unchecked area.

Since the number of core units, arrangement form, and shape of the case are the same as those described above, further description will be omitted.

By increasing the number of cores and changing the shape of the case, the Eddy current sensor of the present invention shows an effect of improving the crack detection power as the sensing position precision increases by one-point sensing, in a state that the battery cell, which is the object to be inspected, is fixed.

The present invention also provides a battery cell crack detection device including the eddy current sensor.

FIG. 4 is a schematic diagram of a battery cell crack detection device according to the present invention. Referring to FIG. 4, the crack detection device 1000 of the present invention includes:

an eddy current sensor 1100;

a transfer unit 1200 configured to sequentially transfer a plurality of battery cells from a point where the battery cells are input to a point where the battery cells are taken out; and a controller (not shown) configured to be electrically connected to the eddy current sensor and receive, evaluate and control the eddy current signal sensed by the eddy current sensor.

Hereinafter, the transfer unit 1200 will be described.

FIG. 6 is a detailed view of the transfer unit 1200 of FIG. 5. Referring to these drawings, the transfer unit 1200 includes: a transfer die 1210 extending from an input point to an exit point of the battery cell; transfer means 1220, 1230 and 1240 for transferring the battery cells.

The charged battery cell (B) of the crack detection device of the present invention is transferred to the eddy current sensor 1100 by the transfer unit 1200, and is transferred to an outlet and taken out after the inspection by the eddy current sensor 1100 is finished. The plurality of battery cells B are sequentially input to the transfer unit 1200, and the battery cells are arranged and transferred at regular intervals.

The transfer means may include: a lifting unit 1220 for elevating the battery cell from the transfer die; and a driving unit 1240 to which the lifting unit 1220 is movably coupled and which transfers the lifting unit in the transfer direction of the battery cell. As long as the driving unit moves the lifting unit, various forms may be applied.

The lifting unit may be a cylinder that reciprocates up and down by oil pressure or air pressure. Hereinafter, an embodiment of the lifting unit will be described.

Referring to FIG. 5, the lifting unit 1220 extends in a direction parallel to the transfer direction of the battery cell B, and has a narrow and long cuboid shape, and two long cuboids are spaced apart above and below the center line parallel to the longitudinal direction (the traveling direction of the battery cell) of the transfer die. These cuboid-shaped lifting units support the battery cell B and move the battery cells while moving in the transfer direction of the battery cells together as the driving unit 1240 moves.

In one embodiment of the present invention, the lifting unit may include at least one or more adsorption holes 1230 for adsorption of the battery cells. The number of adsorption holes 1230 can be appropriately adjusted as needed.

The lifting unit 1220 adsorbs the battery cells to pick up the battery cells, and is extended from the driving unit 1240 and is lifted for adsorption of the battery cells. In the driving unit 1240, a surface opposite to a surface, on which the battery cell is mounted based on the transport die, may be installed on a lower surface of the transfer die 1210. In order for the lifting unit to pass through the transfer die and rise to an upper part of the transfer die, the transfer die 1210 may include an opening 1250 at a portion corresponding to the lifting unit.

When the lifting unit extends from the driving unit and passes through the transfer die and rises to the upper part of the transfer die, a vacuum is applied through the adsorption hole 1230 so that the battery cell is fixed to the lifting unit.

As described above, as the lifting unit can adsorb the battery cell, the crack detection device of the present invention exhibits an effect that the alignment of the battery cells is disturbed, the battery cells are removed from the lifting unit, or vibration of the battery cells can be suppressed.

In an embodiment of the present invention, an embodiment of applying the vacuum through the adsorption hole in order to adsorb the battery cell by the lifting unit is illustrated. Herein, as long as the lifting unit can fix the battery cell, various forms can be applied without being limited to the above method.

In one embodiment of the present invention, the transfer unit may have a plurality of unit movement sections, and the transfer means may perform a reciprocating movement at one unit movement section or two or more unit movement sections.

Referring to FIG. 4, the transfer unit has a plurality of unit movement sections (a). The transfer means picks up the battery cell placed at the start point of the unit movement section and transfers it to the start point of the adjacent unit movement section. The transfer means, which has completed the transfer of the battery cells in the unit movement section, returns to the starting point of the unit movement section again. The above process is repeated, and a plurality of battery cells are sequentially transferred.

FIG. 6 shows the transfer die 1210 according to an embodiment of the present invention, and referring to this, the transfer die 1210 may include a nest 1260 in which a battery cell is seated between one unit movement section and an adjacent unit movement section.

The nest 1260 is formed with a receiving groove filled therein according to the shape of the battery cell, and the battery cell B is seated on the nest. As the battery cells are transferred from the input point to the inspection area, the alignment of the battery cells may be disturbed. In the crack detection device of the present invention, a nest is provided on the transfer die, so that the battery cells are aligned by being seated on the nest.

Referring to FIG. 6, the receiving grooves are respectively formed in a direction parallel to the traveling direction of the battery cell and a direction orthogonal to the traveling direction of the battery cell, thereby forming an appearance that a cross shape is embedded in the inside. This is for inspection in the longitudinal direction of the battery cell and in the width direction of the battery cell during inspection of the battery cell.

A process in which a battery cell B to be inspected is put into and taken out of the inspection apparatus of the present invention will be described in detail.

The transfer die constituting the transfer unit of the present invention is provided with a plurality of nests.

If a battery cell is put in a nest located at a battery cell input point, the lifting unit 1220 extends from the driving unit 1240 in the direction of the transfer die, and the lifting unit 1220 rises through the opening 1250 of the transfer die 1210.

The lifting unit 1220 rose to the upper part of the transfer die adsorbs and fixes the battery cell B seated on the nest. This is for minimizing separation of the battery cell from the transfer means, misalignment during the transfer, or movement of the battery cell during inspection. The method in which the lifting unit adsorbs the battery cell is not limited to the above-described embodiment as long as movement during the transfer of the battery cell can be minimized.

The lifting unit 1220 is movably coupled to the driving unit 1240, and a reciprocating movement is possible through the operation of the driving unit. The lifting unit 1220 having adsorbed the battery cell maintains a raised state and moves toward the direction in which the eddy current sensor 1100 has been installed through the operation of the driving unit. At this time, the battery cells that were supported or adsorbed by the lifting unit are also transferred.

The lifting unit transfers the adsorbed battery cell to an adjacent nest, and the lifting unit that completes the transfer to the adjacent nest releases the vacuum. The lifting unit that releases the vacuum is lowered again toward the driving unit installed at the bottom of the transfer die, and the driving unit returns to the original position together with the lifting unit. Thus, one battery cell is transferred from one unit movement section to an adjacent movement section. Then, this process is repeated sequentially, and the battery cell reaches the nest closest to the eddy current sensor 1100 from the input point.

In one embodiment of the present invention, the internal crack inspection apparatus of the present invention may further include an alignment unit that aligns the battery cells seated in a nest closest to the inspection unit. By aligning the battery cells immediately before performing the eddy current inspection, the reliability of the inspection can be improved.

The battery cells aligned by the alignment unit are adsorbed to the lifting unit 1220 again, and undergo eddy current inspection by the first sensor and the second sensor by one-point measurement method.

The battery cell that has completed the eddy current inspection by the eddy current sensor is transferred to the point at which the battery cell is taken out by the transfer means including the lifting unit and the driving unit.

The controller will be described in detail. The controller constituting the crack detection device of the present invention is electrically connected to the eddy current sensor, receives and evaluates the eddy current signal sensed by the eddy current sensor, and functions to control the detection apparatus of the present invention.

The controller may receive and display information on the eddy current signal, and determine the presence or absence of an internal crack, a location, etc. by the displayed image. In an embodiment of the present invention, the eddy current signal sensed by the eddy current sensor may be a voltage, and the presence or absence of a crack and the location of the crack may be detected based on thereon.

The controller receives the voltage sensed by the eddy current sensor, records the voltage, and detects the presence and location of cracks from the measured voltage value according to the detected position.

The controller may control the eddy current sensor and the transfer unit. The controller may be configured as a conventional programmable electronic computer coupled with a memory for controlling the transfer and the speed of a plurality of battery cells.

The crack detection device of the present invention is to determine a crack based on a change in the eddy current signal, and is useful when detecting a crack in a pouch type lithium secondary battery.

Hereinafter, the pouch type lithium secondary battery of the present invention to be tested will be described in detail.

In general, lithium secondary batteries can be classified according to the structure of the electrode assembly of the positive electrode/separator/negative electrode structure. There may be a jelly-roll (winding type) electrode assembly with a structure in which long sheet-shaped positive electrodes and negative electrodes are wound with a separator interposed therebetween, and a stacked electrode assembly in which a number of positive and negative electrodes cut in units of a predetermined size are sequentially stacked with a separator interposed therebetween. There may also be a stack/folding electrode assembly with a structure in which bi-cells or full cells, in which positive and negative electrodes of a predetermined unit are stacked with a separator interposed therebetween, are wound.

In recent years, a pouch type battery having a stack type or stack/folding type electrode assembly embedded in a pouch-shaped battery case of an aluminum laminate sheet has attracted a lot of attention due to its low manufacturing cost and small weight, and the amount used thereof is gradually increasing.

The pouch-type lithium secondary battery includes an electrode assembly, electrode tabs extending from the electrode assembly, electrode leads welded to the electrode tabs, and a battery case accommodating the electrode assembly.

The electrode assembly is a power generation device in which a positive electrode and a negative electrode are sequentially stacked with a separator interposed therebetween. The electrode assembly 130 has a stack-type structure or a stack/folding-type structure. The electrode tabs extend from each electrode plate of the electrode assembly, and the electrode leads are electrically connected to a plurality of electrode tabs extending from each electrode plate, for example by welding, and a part of the electrode lead is exposed outside of the battery case. An insulating film is attached to a portion of the upper and lower surfaces of the electrode leads in order to increase the degree of sealing with the battery case and to secure an electrically insulated state.

The battery case is typically made of an aluminum laminate sheet, provides a space for accommodating the electrode assembly, and has a pouch shape as a whole. In the case of the stacked electrode assembly, the upper end of the inside of the battery case is spaced from the electrode assembly so that a plurality of positive electrode tabs and a plurality of negative electrode tabs can be combined together with the electrode lead.

Since the pouch-type lithium secondary battery has an electrode, an electrode tab, tab welding portion, and a lead welding portion inside the battery case as described above, it is difficult to detect a crack from the outside, but if a detection device using eddy current is used as in the present invention, cracks in the pouch type secondary battery can be detected.

The present invention has been described with reference to the embodiments shown in the drawings, but this is only exemplary, and those of ordinary skill in the art to which the art pertains will appreciate that various modifications and other equivalent embodiments are possible. Therefore, the true technical protection scope of the present invention should be defined by the claims.

The invention claimed is:

1. An eddy current sensor for inducing an eddy current and detecting the induced eddy current to detect a crack in a battery cell, comprising:
   at least two core units, each core unit including a coil wound around a magnetic member; and
   a case which accommodates the at least two core units,
   wherein each of the core units is arranged such that a central axis of the coil is oriented in a thickness direction of a battery cell,
   wherein the case comprises:
      a first stage extending toward a longitudinal direction of the battery cell and having a step corresponding to a shape extending from the battery cell to an electrode lead, and having a cuboid shape; and
      a second stage extending toward the electrode lead in a thickness direction of the battery cell from the first stage and having a cuboid shape,
   wherein the first stage and the second stage are integrated to form the step, and
   wherein an area of a side parallel to a ground of the first stage is larger than an area of a side parallel to a ground of the second stage.

2. The eddy current sensor of claim 1, wherein one pair of the core units are spaced apart from each other on an extension line in a first direction parallel to a width direction of the battery cell.

3. The eddy current sensor of claim 2,
   wherein one pair of the core units are parallel to the width direction of the battery cell, and are spaced apart on an extension line in a second direction different from the first direction.

4. The eddy current sensor of claim 2, wherein a spaced distance is 50 to 100% of the width of the battery cell.

5. The eddy current sensor of claim 1,
   wherein one pair of the core units are disposed at the first stage, and
   wherein one pair of the core units are disposed at the second stage.

6. The eddy current sensor of claim 1, further comprising:
   a first sensor configured to induce an eddy current; and
   a second sensor configured to sense an eddy current signal induced by the first sensor,
   wherein each of the first sensor and the second sensor includes the core units and the case.

7. The eddy current sensor of claim 1, wherein the magnetic member has a cylindrical column or rectangular column shape.

8. The eddy current sensor of claim 1, wherein the magnetic member has a rectangular column shape.

9. The eddy current sensor of claim 1, wherein in a state that the battery cell is fixed, a crack is detected by one-point sensing.

10. The eddy current sensor of claim 1, wherein the crack of the battery cell is a crack generated at one or more locations selected from an electrode tab, a tab welding portion and a lead welding portion.

11. A device for detecting a crack of a battery cell, comprising:
- the eddy current sensor of claim 1;
- a transfer unit configured to sequentially transfer a plurality of the battery cells from a point where the battery cells are input to a point where the battery cells are taken out; and
- a controller configured to be electrically connected to the eddy current sensor and receive, evaluate and control an eddy current signal sensed by the eddy current sensor.

12. The device of claim 11, wherein the transfer unit comprises:
- a transfer die configured to be extended from an input point to a discharge point of the battery cell; and
- a transfer means configured to transfer the battery cell.

13. The device of claim 12, wherein the transfer means comprises:
- a lifting unit configured to elevate the battery cell from the transfer die; and
- a driving unit configured to be coupled with the lifting unit to be movable and allow the lifting unit to be reciprocated in a horizontal direction.

* * * * *